United States Patent
Basceri et al.

(10) Patent No.: US 7,033,642 B2
(45) Date of Patent: *Apr. 25, 2006

(54) PLASMA ENHANCED CHEMICAL VAPOR DEPOSITION METHOD OF FORMING A TITANIUM SILICIDE COMPRISING LAYER

(75) Inventors: Cem Basceri, Boise, ID (US); Irina Vasilyeva, Boise, ID (US); Ammar Derraa, Boise, ID (US); Philip H. Campbell, Meridian, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

This patent is subject to a terminal disclaimer.

(21) Appl. No.: 10/666,025

(22) Filed: Sep. 17, 2003

(65) Prior Publication Data

US 2005/0079697 A1 Apr. 14, 2005

Related U.S. Application Data

(62) Division of application No. 10/094,580, filed on Mar. 6, 2002, now Pat. No. 6,767,823.

(51) Int. Cl.
*C23C 16/14* (2006.01)
*C23C 16/24* (2006.01)
(52) U.S. Cl. .......................... 427/255.391; 427/255.17
(58) Field of Classification Search ......... 427/255.391, 427/255.393, 255.7; 134/2, 1.3
See application file for complete search history.

(56) References Cited

U.S. PATENT DOCUMENTS

| | | | |
|---|---|---|---|
| 4,957,777 | A | 9/1990 | Ilderem et al. |
| 5,240,739 | A | 8/1993 | Doan et al. |
| 5,252,518 | A | 10/1993 | Sandhu et al. |
| 5,278,100 | A | 1/1994 | Doan et al. |
| 5,344,792 | A | 9/1994 | Sandhu et al. |

(Continued)

OTHER PUBLICATIONS

U.S. Appl. No. 09/944,903, filed Aug. 30, 2001, Derraa et al. (as filed).

(Continued)

*Primary Examiner*—Michael Cleveland
*Assistant Examiner*—David Turocy
(74) *Attorney, Agent, or Firm*—Wells St. John P.S.

(57) ABSTRACT

Chemical vapor deposition methods of forming titanium silicide including layers on substrates are disclosed. $TiCl_4$ and at least one silane are first fed to the chamber at or above a first volumetric ratio of $TiCl_4$ to silane for a first period of time. The ratio is sufficiently high to avoid measurable deposition of titanium silicide on the substrate. Alternately, no measurable silane is fed to the chamber for a first period of time. Regardless, after the first period, $TiCl_4$ and at least one silane are fed to the chamber at or below a second volumetric ratio of $TiCl_4$ to silane for a second period of time. If at least one silane was fed during the first period of time, the second volumetric ratio is lower than the first volumetric ratio. Regardless, the second feeding is effective to plasma enhance chemical vapor deposit a titanium silicide including layer on the substrate.

39 Claims, 1 Drawing Sheet

U.S. PATENT DOCUMENTS

| | | | |
|---|---|---|---|
| 5,376,405 A | | 12/1994 | Doan et al. |
| 5,954,887 A | * | 9/1999 | Hatano ............................ 134/2 |
| 5,976,976 A | * | 11/1999 | Doan et al. .................. 438/683 |
| 6,019,839 A | | 2/2000 | Achutharaman et al. |
| 6,086,442 A | | 7/2000 | Sandhu et al. |
| 6,174,809 B1 | * | 1/2001 | Kang et al. .................. 438/682 |
| 6,245,674 B1 | * | 6/2001 | Sandhu ........................ 438/674 |
| 6,255,216 B1 | | 7/2001 | Doan et al. |
| 6,404,058 B1 | * | 6/2002 | Taguwa ....................... 257/770 |
| 6,444,556 B1 | | 9/2002 | Sharan et al. |
| 6,472,756 B1 | | 10/2002 | Doan et al. |
| 6,554,910 B1 | | 4/2003 | Sandhu et al. |
| 6,586,285 B1 | * | 7/2003 | Basceri et al. ............... 438/151 |
| 6,734,051 B1 | * | 5/2004 | Basceri et al. ............... 438/151 |

OTHER PUBLICATIONS

U.S. Appl. No. 09/945,065, filed Aug. 30, 2001, Derraa et al. (as filed).

* cited by examiner

PLASMA ENHANCED CHEMICAL VAPOR DEPOSITION METHOD OF FORMING A TITANIUM SILICIDE COMPRISING LAYER

RELATED PATENT DATA

This patent resulted from a divisional application of U.S. patent application Ser. No. 10/094,580, filed Mar. 6, 2002, entitled "Plasma Enhanced Chemical Vapor Deposition Method of Forming Titanium Silicide Comprising Layers", naming Cem Basceri, Irina Vasilyeva, Ammar Derraa, Philip H. Campbell and Gurtej S. Sandhu as inventors, the disclosure of which is incorporated by reference.

TECHNICAL FIELD

This invention relates to plasma enhanced chemical vapor deposition methods of forming titanium silicide comprising layers.

BACKGROUND OF THE INVENTION

Conductively doped silicon regions are conventionally utilized as source/drain regions of field effect transistors and as other node locations in integrated circuitry. In fabricating integrated circuitry having such regions, insulative layers are typically fabricated over the regions and contact openings are formed therethrough to the regions. Conductive material is ultimately received within the openings and makes electrical connection with the conductively doped source/drain or other regions. Exemplary conductive materials include conductively doped polysilicon and other semiconductive materials, metals, and metal compounds.

Refractory metal silicides, such as titanium silicide, have been utilized as part of the conductive material, typically as an interface region between the conductively doped silicon region and other overlying conductive material. One prior art method of forming the titanium silicide is to deposit elemental titanium and thereafter heat the substrate to cause a reaction of the deposited titanium with underlying silicon to form the silicide. Alternately, deposition conditions can be selected such that the depositing titanium reacts with the silicon from the substrate during deposition to form the silicide. In either instance, silicon is consumed from the underlying substrate diffusion junction region in forming the silicide.

In certain applications, particularly in light of the ever-increasing density of circuitry being fabricated, it is highly undesirable for a significant quantity of the underlying silicon of the junction to be consumed. Accordingly, methods have been developed which prevent, or at least reduce, underlying silicon consumption by providing a silicon source other than or in addition to the silicon of the substrate for forming the silicide. One prior art method is to plasma enhance, chemically vapor deposit the silicide by combining a silane gas and $TiCl_4$ under suitable reaction conditions to form titanium silicide which deposits over the junction region with minimal if any consumption of substrate silicon. Unfortunately, the wafer surface has been found on occasion to become contaminated with particles in processes utilizing $TiCl_4$ and a silane as compared to primarily forming the silicide by reacting titanium with silicon of the substrate.

It was surmised that the particles which were undesirably forming on the wafers might be occurring during either of both of the actual titanium silicide deposition or after the deposition when the wafers were being moved into and out of the reactor chamber. While unclear, it was theorized that the particle formation might be occurring from silane and/or chlorine constituents adhering to the chamber sidewalls perhaps as a result of the deposition, or that chlorine was somehow undesirably being added to the chamber walls during a chamber cleaning which uses chlorine intermediate each wafer deposition.

For example, one exemplary prior art processing intending to reduce particle count employs a $Cl_2$ clean between titanium suicide depositions on separate wafers. For example, after a silicide deposition on one wafer within a reactor chamber, the wafer is removed from the chamber. Then, an argon flow of 500 sccm as a purge gas is flowed through the chamber. This is followed by a $Cl_2$ flow of 2,000 sccm for two seconds as a stabilizing step, with the $Cl_2$ flow then being continued at 2,000 sccm for an additional 15 seconds. The intended effect of the $Cl_2$ clean is to remove titanium material which might undesirably adhere to the internal surfaces of the chamber during the titanium silicide deposition. Upon completion of the $Cl_2$ cleaning step, an 8,000 sccm argon purge feeding is conducted to remove the chlorine. This is followed by a flow of Ar at 8,000 sccm in combination with 1,000 sccm of He. He is lighter than Ar, and can facilitate chamber purging and cleaning, and also facilitates temperature control within the chamber. Subsequently, another wafer is provided within the chamber, and titanium silicide deposition is conducted.

The above-described cleaning process is typically conducted between each single wafer deposition, and typically in the absence of plasma. Yet every 10 to 20 wafer depositions, the chamber is also typically subjected to a plasma clean with $Cl_2$ to better clean/remove titanium from the chamber walls. Further, every 5,000 or so wafer depositions, the whole system is subjected to an atmospheric/room ambient pressure wet clean and scrub (i.e., using $NH_4OH$, $H_2O_2$ and isopropyl alcohol in various steps) whereby the whole system is cleaned out. The other above-described cleanings are typically conducted with the reactor chamber essentially at the deposition pressure and temperature conditions.

The invention was principally motivated towards overcoming the above-described surface defect issues, but is in no way so limited. The invention is only limited by the accompanying claims as literally worded without limiting or interpretative reference to the specification, and in accordance with the doctrine of equivalents.

SUMMARY

The invention includes chemical vapor deposition methods of forming titanium suicide comprising layers on substrates. In one aspect, a substrate is provided within a plasma enhanced chemical vapor deposition chamber. In one implementation, $TiCl_4$ and at least one silane are first fed to the chamber at or above a first volumetric ratio of $TiCl_4$ to silane for a first period of time. The first volumetric ratio is sufficiently high to avoid measurable deposition of titanium silicide on the substrate. In another implementation, $TiCl_4$ is first fed to the chamber without feeding any measurable silane to the chamber for a first period of time. Regardless, after the first feeding for the first period of time, $TiCl_4$ and at least one silane are fed to the chamber at or below a second volumetric ratio of $TiCl_4$ to silane for a second period of time. If at least one silane was fed during the first period of time, the second volumetric ratio is lower than the first volumetric ratio. Regardless, the second feeding is effective to plasma enhance chemical vapor deposit a titanium silicide comprising layer on the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
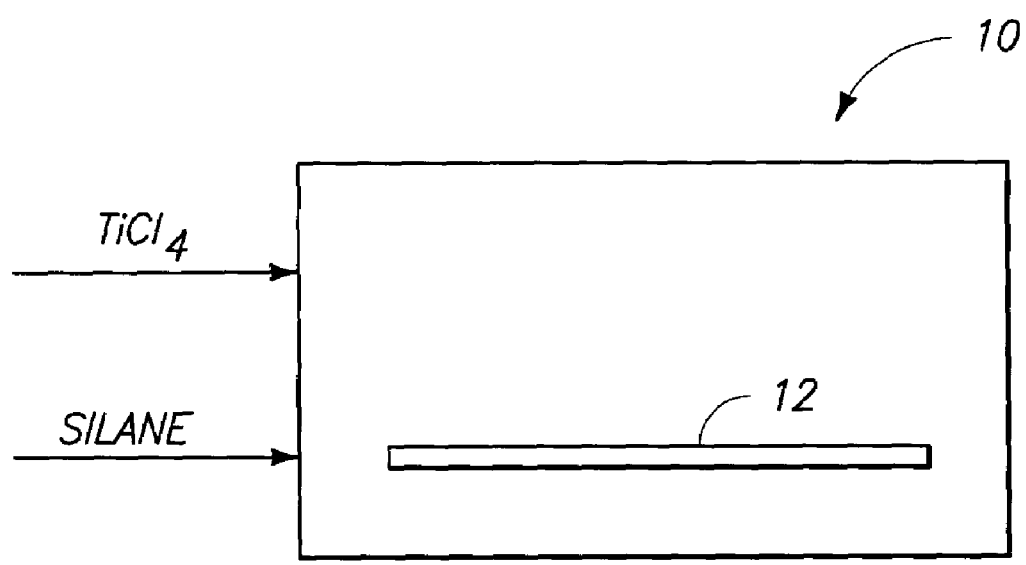
FIG. 1 is a diagrammatic perspective view of a semiconductor wafer fragment/section in process in a chemical vapor deposition reactor chamber in accordance with an aspect of the invention.

This disclosure of the invention is submitted in furtherance of the constitutional purposes of the U.S. Patent Laws "to promote the progress of science and useful arts" (Article 1, Section 8).

The invention encompasses a plasma enhanced chemical vapor deposition method of forming a titanium silicide comprising layer over a substrate using a reactive gas comprising $TiCl_4$ and at least one silane. The description and concluding claims include references to first and second feedings, ratios, etc. Such only indicate sequence with regard to the respective acts or nouns which they qualify, and in no way preclude other processing, including the stated acts, occurring intermediate the stated processings, nor do they preclude processings prior to the first stated processing or the last stated processing.

In accordance with an aspect of the invention, a substrate is positioned within a chemical vapor deposition reactor. By way of example only, the substrate typically will comprise a semiconductor wafer or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The chemical vapor deposition reactor includes plasma enhancement, either directly within the chamber or remote from the chamber. The invention was reduced to practice in a single wafer processor, although any other suitable reactor is contemplated, whether existing or yet-to-be developed. In a first and most preferred embodiment, $TiCl_4$ is first fed to the chamber without feeding any measurable silane to the chamber for a first period of time. Further most preferably, nothing other than $TiCl_4$ is fed to the chamber during the first period of time. In a 6.55 liter reactor, exemplary preferred flow rates for the $TiCl_4$ are from 50 sccm to 150 sccm. Further preferably, the first feeding comprises plasma generation within the chamber. An exemplary existing plasma enhanced chemical vapor deposition system usable in conjunction with the above-described process is the Centura Model #2658 available from Applied Materials of Santa Clara, Calif. An exemplary preferred plasma generating power range is from 200 watts to 600 watts. A preferred substrate temperature is from 600° C. to 700° C., with a preferred chamber pressure range being from 3 Torr to 6 Torr. Alternately but less preferred, the first feeding does not need to comprise any plasma generation. The first period of time is preferably no greater than 5 seconds, with no greater than 3 seconds being more preferred.

In an alternate but less preferred embodiment, the first feeding encompasses feeding $TiCl_4$ and at least one silane to the chamber at or above a first volumetric ratio of $TiCl_4$ to silane for a first period of time. The first volumetric ratio is chosen to be sufficiently high to avoid measurable deposition of titanium silicide on the substrate. An expected minimum first volumetric ratio under typical deposition conditions is 500:1. More preferably, the first volumetric ratio is at least 750:1, and even more preferably at least 1,000:1. Accordingly, in respective preferred embodiments, the volumetric ratio of $TiCl_4$ is equal to or greater than these respective ratios. An exemplary silane is $SiH_4$, with silanes including more than one silicon atom, and organic silanes, also of course being contemplated. Regardless, exemplary preferred silane flow rates are to provide at least the above-described preferred embodiment volumetric ratios. Additional gases beyond $TiCl_4$ and at least one silane are also contemplated, but are believed to be less preferred. Where one or more silanes is/are fed during the first feeding, the first feeding might be at multiple volumetric ratios of $TiCl_4$ to all silane during the first period, or be at a substantially constant volumetric ratio of $TiCl_4$ to all silane during the first period of time.

FIG. 1 depicts an exemplary embodiment chemical vapor deposition reactor 10. A substrate 12 to be processed in accordance with an aspect of the invention is shown positioned therein. Separate $TiCl_4$ and silane feed streams are shown feeding to chamber 10. Such diagrammatically illustrates and represents one preferred embodiment whereby the $TiCl_4$ and silane are fed to the chamber from separate injection ports during the first feeding. Most preferably, the $TiCl_4$ and silane are not mixed prior to feeding to the chamber, and not otherwise mixed prior to being emitted to proximate the substrate within the chamber, during the first feeding.

Regardless of whether any silane is fed during the first feeding, after the first feeding, $TiCl_4$ and at least one silane are fed to the chamber for a second period of time effective to plasma enhance chemical vapor deposit a titanium suicide comprising layer on the substrate. Plasma generation can be direct within the chamber, or remote therefrom. Any suitable gas components within the chamber, whether existing or yet-to-be developed, including $TiCl_4$ and a silane are contemplated. As above, an exemplary silane is $SiH_4$, with silanes including more than one silicon atom, and organic silanes, also of course being contemplated. By way of example only, one preferred process of forming a titanium silicide comprising layer includes plasma enhanced chemical vapor depositions at an exemplary power range of from 200 watts to 600 watts, a substrate temperature range of from 600° C. to 700° C. and a chamber pressure range of from 3 Torr to 6 Torr. Exemplary processing gases include SiH4 at from 0.5 sccm to 10 sccm, $TiCl_4$ at from 50 sccm to 150 sccm, Ar at from 2,000 sccm to 6,000 sccm, He at from 1,000 sccm to 2,000 sccm and $H_2$ at from 200 sccm to 10,000 sccm in a 6.55 liter chamber. Such exemplary processing can be conducted to plasma enhance chemical vapor deposit a titanium suicide comprising layer which consists essentially of titanium silicide. The second period of time for the deposition is advantageously chosen to provide the selected thickness deposition of a desired titanium silicide comprising layer over the substrate.

Typically and preferably, the second period of time is greater than the first period of time. Further, where at least one silane was fed to the chamber during the first feeding, the second or deposition feeding will include a second volumetric ratio of $TiCl_4$ to all silane which is lower than the first volumetric ratio.

The second feeding will occur at some selected chamber deposition pressure or pressure range, and at a selected substrate temperature or temperature range. In one preferred aspect of the invention, the first and second feedings are conducted at the same second feeding chamber deposition pressure and substrate temperature conditions, and the $TiCl_4$ flow rate during the first and second feedings is at a substantially constant volumetric flow rate. Further, plasma conditions preferably remain constant throughout. Alternately but less preferred, the flow rate of $TiCl_4$ during the first and second feedings can be at different volumetric flow rates.

A preferred although non-limiting effect is to provide a large quantity of $TiCl_4$ within the chamber, initially prior to the provision of a deposition quantity of silane such that the propensity of the silane when increased to deposition quantity conditions is to interact with the $TiCl_4$ at a much greater rate than with any components within the chamber relative to either reacting therewith or adhering thereto. Thus, silane adherence to chamber surfaces and as a source for subsequent contamination is ideally minimized.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A plasma enhanced chemical vapor deposition method of forming a titanium silicide-comprising layer over a substrate using a reactive gas comprising $TiCl_4$ and at least one silane, comprising:
   providing a substrate within a plasma enhanced chemical vapor deposition chamber;
   with the substrate in the chamber, first feeding $TiCl_4$ to the chamber without feeding any measurable silane to the chamber for a first period of time; and
   after the first feeding for the first period of time, second feeding $TiCl_4$ and at least one silane to the chamber for a second period of time effective to plasma enhance chemical vapor deposit a titanium silicide-comprising layer onto the substrate received within the chamber during the first feeding, the titanium silicide-comprising layer deposited during the second period of time being deposited directly on a conductively doped silicon surface of the substrate.

2. The method of claim 1 wherein the second feeding occurs at selected chamber deposition pressure and substrate temperature conditions, the first feeding also occurring at the selected second feeding chamber deposition pressure and substrate temperature conditions.

3. The method of claim 1 wherein the feeding of $TiCl_4$ during the first and second feedings is at a substantially constant volumetric flow rate.

4. The method of claim 1 wherein the feeding of $TiCl_4$ during the first and second feedings is at different volumetric flow rates.

5. The method of claim 1 wherein the first period of time is less than the second period of time.

6. The method of claim 1 wherein the first period of time is no greater than 5 seconds.

7. The method of claim 1 wherein the first period of time is no greater than 3 seconds.

8. The method of claim 1 wherein,
   the second feeding occurs at selected chamber deposition pressure and substrate temperature conditions, the first feeding also occurring at the selected second feeding chamber deposition pressure and substrate temperature conditions; and
   the first period of time is less than the second period of time.

9. The method of claim 1 wherein the first feeding comprises plasma generation within the chamber.

10. The method of claim 9 further comprising continuing plasma generation within the chamber from the first feeding through the second feeding.

11. The method of claim 1 wherein the first feeding does not comprise plasma generation within the chamber.

12. The method of claim 1 wherein the $TiCl_4$ and silane are fed to the chamber from separate injection ports during the second feeding.

13. The method of claim 1 wherein the $TiCl_4$ and silane are mixed prior to feeding to proximate the substrate within the chamber during the second feeding.

14. A plasma enhanced chemical vapor deposition method of forming a titanium silicide-comprising layer over a substrate using a reactive gas comprising $TiCl_4$ and at least one silane, comprising:
   providing a substrate within a plasma enhanced chemical vapor deposition chamber;
   with the substrate in the chamber, first feeding $TiCl_4$ to the chamber without feeding any measurable silane to the chamber for a first period of time, and wherein nothing other than $TiCl_4$ is fed to the chamber during the first period of time; and
   after the first feeding for the first period of time, second feeding $TiCl_4$ and at least one silane to the chamber for a second period of time effective to plasma enhance chemical vapor deposit a titanium silicide-comprising layer on the substrate received within the chamber during the first feeding.

15. The method of claim 14 wherein the second feeding occurs at selected chamber deposition pressure and substrate temperature conditions, the first feeding also occurring at the selected second feeding chamber deposition pressure and substrate temperature conditions.

16. The method of claim 14 wherein the feeding of $TiCl_4$ during the first and second feedings is at a substantially constant volumetric flow rate.

17. The method of claim 14 wherein the feeding of $TiCl_4$ during the first and second feedings is at different volumetric flow rates.

18. The method of claim 14 wherein the first period of time is less than the second period of time.

19. The method of claim 14 wherein the first period of time is no greater than 5 seconds.

20. The method of claim 14 wherein the first period of time is no greater than 3 seconds.

21. The method of claim 14 wherein,
   the second feeding occurs at selected chamber deposition pressure and substrate temperature conditions, the first feeding also occurring at the selected second feeding chamber deposition pressure and substrate temperature conditions; and
   the first period of time is less than the second period of time.

22. The method of claim 14 wherein the first feeding comprises plasma generation within the chamber.

23. The method of claim 22 further comprising continuing plasma generation within the chamber from the first feeding through the second feeding.

24. The method of claim 14 wherein the first feeding does not comprise plasma generation within the chamber.

25. The method of claim 14 wherein the $TiCl_4$ and silane are fed to the chamber from separate injection ports during the second feeding.

26. The method of claim 14 wherein the $TiCl_4$ and silane are mixed prior to feeding to proximate the substrate within the chamber during the second feeding.

27. A plasma enhanced chemical vapor deposition method of forming a titanium silicide-comprising layer over a substrate using a reactive gas comprising $TiCl_4$ and at least one silane comprising:
   providing a substrate within a plasma enhanced chemical vapor deposition chamber;
   with the substrate in the chamber, first feeding $TiCl_4$ to the chamber without feeding any measurable silane to the chamber for a first period of time, and wherein nothing other than $TiCl_4$ is fed to the chamber during the first period of time; and
   after the first feeding for the first period of time, second feeding $TiCl_4$ and at least one silane to the chamber for a second period of time effective to plasma enhance chemical vapor deposit a titanium silicide-comprising layer onto a conductively doped silicon surface on the substrate received within the chamber during the first feeding.

28. The method of claim 27 wherein the second feeding occurs at selected chamber deposition pressure and substrate temperature conditions, the first feeding also occurring at the selected second feeding chamber deposition pressure and substrate temperature conditions.

29. The method of claim 27 wherein the feeding of $TiCl_4$ during the first and second feedings is at a substantially constant volumetric flow rate.

30. The method of claim 27 wherein the feeding of $TiCl_4$ during the first and second feedings is at different volumetric flow rates.

31. The method of claim 27 wherein the first period of time is less than the second period of time.

32. The method of claim 27 wherein the first period of time is no greater than 5 seconds.

33. The method of claim 27 wherein the first period of time is no greater than 3 seconds.

34. The method of claim 27 wherein,
   the second feeding occurs at selected chamber deposition pressure and substrate temperature conditions, the first feeding also occurring at the selected second feeding chamber deposition pressure and substrate temperature conditions; and
   the first period of time is less than the second period of time.

35. The method of claim 27 wherein the first feeding comprises plasma generation within the chamber.

36. The method of claim 35 further comprising continuing plasma generation within the chamber from the first feeding through the second feeding.

37. The method of claim 27 wherein the first feeding does not comprise plasma generation within the chamber.

38. The method of claim 27 wherein the $TiCl_4$ and silane are fed to the chamber from separate injection ports during the second feeding.

39. The method of claim 27 wherein the $TiCl_4$ and silane are mixed prior to feeding to proximate the substrate within the chamber during the second feeding.

* * * * *

UNITED STATES PATENT AND TRADEMARK OFFICE
CERTIFICATE OF CORRECTION

PATENT NO. : 7,033,642 B2
APPLICATION NO. : 10/666025
DATED : April 25, 2006
INVENTOR(S) : Cem Basceri It is certified that error appears in the above-identified patent and that said Letters Patent is hereby corrected as shown below:

Col. 2, line 9 –
  Replace "titanium suicide depositions on separate wafers. For"
  Insert --titanium silicide depositions on separate wafers. For--

Col. 2, line 50 –
  Replace "of forming titanium suicide comprising layers on"
  Insert --of forming titanium silicide comprising layers on--

Col. 4, line 41 –
  Replace "to plasma enhance chemical vapor deposit a titanium suicide"
  Insert --to plasma enhance chemical vapor deposit a titanium silicide--

Col. 4, line 55 –
  Replace "SiH4 at from 0.5 sccm to 10 sccm, TiCl$_4$ at from 50 sccm to"
  Insert --SiH$_4$ at from 0.5 sccm to 10 sccm, TiCl$_4$ at from 50 sccm to--

Col 4, line 60 –
  Replace "vapor deposit a titanium suicide comprising layer which"
  Insert --vapor deposit a titanium silicide comprising layer which--

Signed and Sealed this

Third Day of April, 2007

JON W. DUDAS
*Director of the United States Patent and Trademark Office*